US009153732B2

(12) United States Patent
Oraw

(10) Patent No.: US 9,153,732 B2
(45) Date of Patent: *Oct. 6, 2015

(54) ACTIVE LED MODULE

(71) Applicant: Nthdegree Technologies Worldwide Inc., Tempe, AZ (US)

(72) Inventor: Bradley S. Oraw, Chandler, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 328 days.

This patent is subject to a terminal disclaimer.

(21) Appl. No.: 13/737,672

(22) Filed: Jan. 9, 2013

(65) Prior Publication Data

US 2013/0221368 A1    Aug. 29, 2013

Related U.S. Application Data

(60) Provisional application No. 61/602,439, filed on Feb. 23, 2012.

(51) Int. Cl.
*H01L 33/00* (2010.01)
*H01L 27/15* (2006.01)
*H01L 23/00* (2006.01)

(52) U.S. Cl.
CPC ............ *H01L 33/0041* (2013.01); *H01L 24/24* (2013.01); *H01L 24/82* (2013.01); *H01L 27/15* (2013.01); *H01L 2224/24137* (2013.01); *H01L 2224/32225* (2013.01); *H01L 2224/73267* (2013.01); *H01L 2924/1033* (2013.01); *H01L 2924/10272* (2013.01); *H01L 2924/12041* (2013.01); *H01L 2924/1301* (2013.01); *H01L 2924/1305* (2013.01); *H01L 2924/13033* (2013.01); *H01L 2924/13055* (2013.01); *H01L 2924/13062* (2013.01); *H01L 2924/13064* (2013.01); *H01L 2924/13091* (2013.01)

(58) Field of Classification Search
CPC ............ H01L 2924/12041; H01L 2924/13064
See application file for complete search history.

(56) References Cited

U.S. PATENT DOCUMENTS

| 7,476,893 | B2 | 1/2009 | Yang et al. | |
|---|---|---|---|---|
| 7,944,035 | B2 | 5/2011 | Bol | |
| 7,977,133 | B2 | 7/2011 | Yoo | |
| 2007/0024213 | A1* | 2/2007 | Shteynberg et al. | 315/291 |
| 2009/0230383 | A1* | 9/2009 | Meng et al. | 257/40 |

(Continued)

OTHER PUBLICATIONS

International Search Report and Written Opinion, 7 pages.

*Primary Examiner* — Whitney T Moore
*Assistant Examiner* — Joseph Galvin, III
(74) *Attorney, Agent, or Firm* — Patent Law Group LLP; Brian D. Ogonowsky

(57) ABSTRACT

LED modules are disclosed having a control MOSFET, or other transistor, in series with an LED. In one embodiment, a MOSFET wafer is bonded to an LED wafer and singulated to form thousands of active 3-terminal LED modules with the same footprint as a single LED. Despite the different forward voltages of red, green, and blue LEDs, RGB modules may be connected in parallel and their control voltages staggered at 60 Hz or greater to generate a single perceived color, such as white. The RGB modules may be connected in a panel for general illumination or for a color display. A single dielectric layer in a panel may encapsulate all the RGB modules to form a compact and inexpensive panel. Various addressing techniques are described for both a color display and a lighting panel. Various circuits are described for reducing the sensitivity of the LED to variations in input voltage.

35 Claims, 10 Drawing Sheets

(56) References Cited

U.S. PATENT DOCUMENTS

| | | | |
|---|---|---|---|
| 2009/0230384 A1* | 9/2009 | Meng et al. | 257/40 |
| 2009/0230883 A1* | 9/2009 | Haug | 315/297 |
| 2011/0108812 A1* | 5/2011 | Sumita et al. | 257/40 |
| 2011/0127581 A1* | 6/2011 | Bethoux et al. | 257/201 |

* cited by examiner

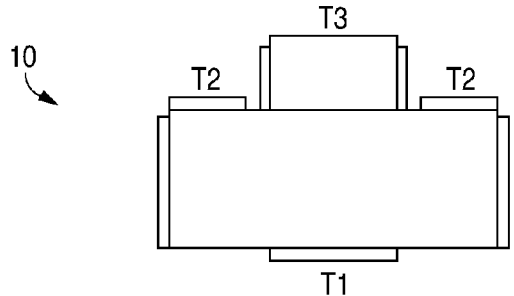
FIG. 3
| T1 | T2 | T3 |
|---|---|---|
| NEGATIVE | POSITIVE | CONTROL |
| NEGATIVE | CONTROL | POSITIVE |
| POSITIVE | NEGATIVE | CONTROL |
| POSITIVE | CONTROL | NEGATIVE |
| CONTROL | POSITIVE | NEGATIVE |
| CONTROL | NEGATIVE | POSITIVE |
FIG. 4
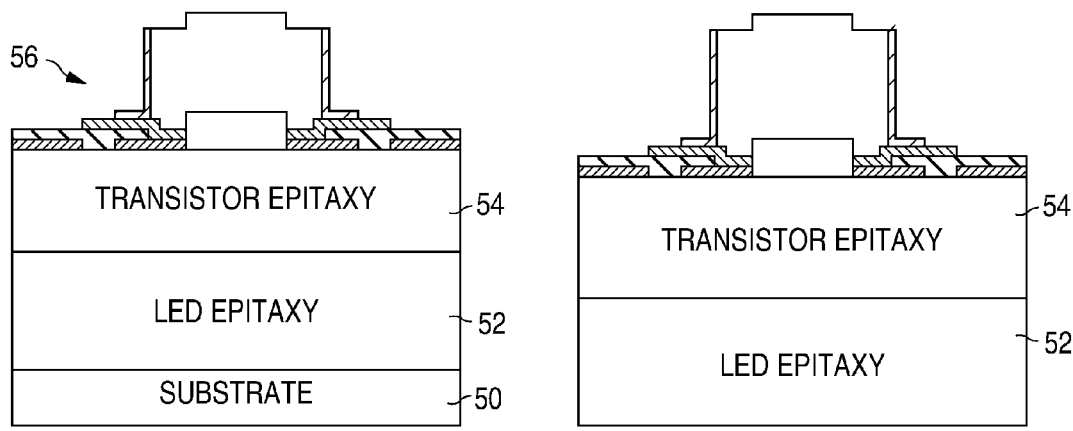
FIG. 5  FIG. 6

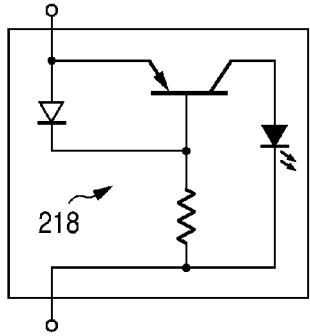
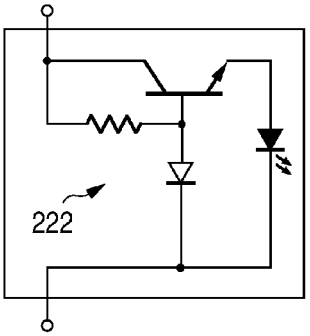
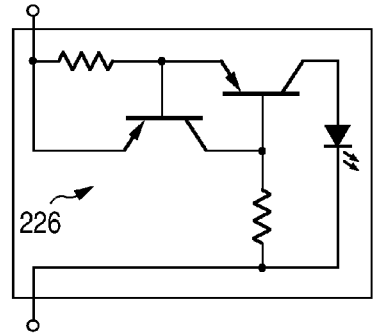
FIG. 33       FIG. 34       FIG. 35
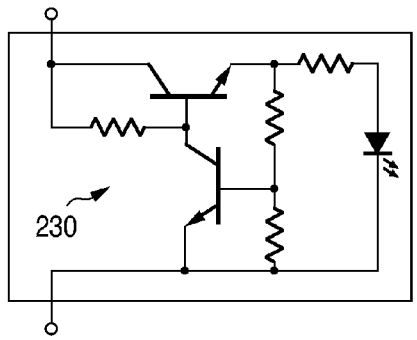
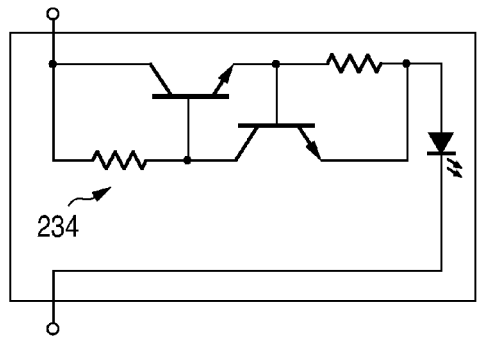
FIG. 36       FIG. 37
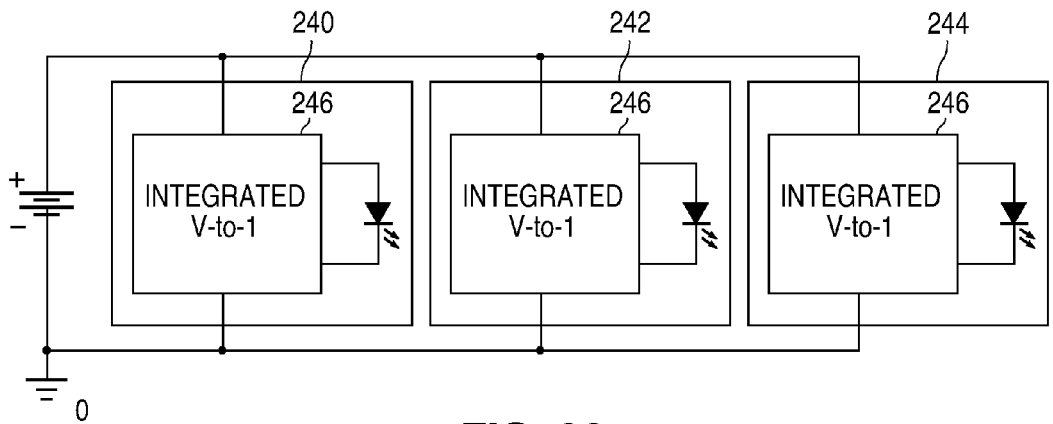
FIG. 38

ACTIVE LED MODULE

FIELD OF THE INVENTION

This invention relates to light emitting diodes (LEDs) and, in particular, to a single die containing active circuitry in series with an LED to control current through the LED.

BACKGROUND

LEDs are typically formed as dies having an anode terminal and a cathode terminal. An LED die is typically mounted on a larger substrate for heat dissipation and packaging. The substrate may contain additional circuitry, such as a passive electrostatic discharge device. The LED die and optional substrate are then typically packaged, where the package has robust anode and cathode leads for being soldered to a printed circuit board (PCB).

LEDs may be controlled by a current source to achieve a desired brightness. The current source may be a MOSFET or a bipolar transistor formed in a separate die. The current source and LED are typically connected together by wires or a PCB.

Providing the current source separate from the LED die requires extra space and interconnections, adding cost. Other disadvantages exist, including the possibility of mismatching components. It would be desirable to provide a very compact LED module with an integrated current source driver circuit.

Additional problems arise when driving multi-colored LEDs, such as in a color display or for creating a white light source. An LED is a two terminal electrical device with non-linear voltage versus current characteristics. Below a particular voltage threshold, the LED is high impedance. Above the threshold, the LED's impedance is much lower. This threshold depends primarily on the bandgap of the semiconductor LED. The bandgap is selected for a particular peak emission wavelength. Red LEDs have bandgaps on the order of 2 eV, blue LEDs have bandgaps on the order of 3 eV, and green LEDs have bandgaps between 2 eV-3 eV. Since the forward voltage is directly related to the bandgap energy, red, green, and blue LEDs cannot simply be connected in parallel to output a desired color or light; each color LED must have its own driver circuit. The different materials (e.g., GaAs, GaN, etc.) used to form the different color LEDs also affect the forward voltages. Further, even within LEDs outputting the same wavelength, their forward voltages vary due to process variations, so even connecting the same color LEDs in parallel is problematic. Providing a separate driver circuit for each LED and interconnecting it to the LED adds space and cost. This is particularly problematic when trying to minimize the size of an RGB pixel in a display.

LEDs can be organized in passive matrix addressable arrays. For instance, a set of LEDs can be connected with their cathodes connected to a row select driver and their anodes connected to a column data bus. Several of these rows can be used to form a larger array addressable by row and column. Providing a controlled current through an addressed row-column will energize the LED(s) at the addressed location(s) to emit the desired color and intensity of light, such as for a color pixel in a display. Since the interconnection between the LEDs is non-zero impedance, the voltage drop throughout the interconnect network can inadvertently forward bias a non-addressed set of LEDs. Such incidental forward bias will cause excess light in non-addressed segments, which reduces light-to-dark contrast of the array.

This problem is made worse by placement of downward facing printed LEDs, where the downward facing LEDs are for reverse bias transient voltage suppression. The downward LEDs are anti-parallel to the upward facing LEDs. In a simple addressing scheme, only the upward LEDs are intended to emit light. When a row is not selected, the associated LEDs are biased at a sub-threshold voltage or possibly reversed biased. Anti-parallel downward LEDs are problematic if the un-selected rows are reversed biased, which forward biases the downward LEDs causing them to emit light, reducing the light-to-dark contrast of the array.

It would be desirable to create integrated LED modules that avoid the above-mentioned problems when connected in an addressable array.

It would also be desirable to create integrated LED modules where LEDs of different colors can be connected in parallel to form a high density of compact RGB pixels.

It would also be desirable to create integrated LED modules of different colors that can be inexpensively packaged together in a single panel for generating light for backlighting, for general illumination, or for a color display.

It would also be desirable to create an interconnection and addressing scheme for multiple LED modules to form a compact light or display panel.

SUMMARY

Problems related to parallel and addressable connections of LEDs, such as in a color display, can be resolved by using active LED modules. In one embodiment, a single vertical LED module includes an LED in series with a vertical drive transistor (a voltage-to-current converter). Three terminals are provided on the module: a positive voltage terminal, a negative voltage terminal, and a control terminal for controlling the current through the LED. The difference between the voltages applied to the positive and negative voltage terminals must be sufficient to energize the LED to its full desired brightness when the control terminal is supplied a maximum value control signal.

The control terminal may be connected to the gate or source of a MOSFET connected in series with the LED. The control terminal is added so that the threshold non-linearity of the LED impedance is actively, rather than passively, controlled. For an LED module where voltage is provided across the power terminals of the module, the low impedance state (where the LED is emitting light) is determined by the control voltage applied to the control terminal. Such an active LED in a parallel or addressable network of LEDs would always be in a high impedance state until the control signal activates the low impedance state. This active impedance control reduces sensitivity to forward voltage and parasitic voltage drops and reverse current paths.

In one example, red, green, and blue LED modules are connected in parallel in an array for a multi-color display, where any set of RGB LEDs (forming a single pixel) is addressable by applying the same voltage across the voltage terminals of the three modules. The control terminal of each module is connected to a different variable control voltage to achieve the desired brightnesses of the red, green, and blue LEDs in the pixel. The control voltages are applied in sequence at 60 Hz or greater so that the different forward voltages of the RGB LEDs are no longer relevant.

In another embodiment, modules are connected in series and parallel for a white light source, where the white point is set by the relative combination of red, green, and blue light. The control voltage for each color and the duty cycle for each color are set to achieve the desired white point.

In other embodiments, various circuits are integrated with the LED to make the brightness of the LED less sensitive to variations in input voltage.

The modules may be formed by bonding an LED wafer to a driver transistor wafer, thereby connecting a terminal of each LED to a terminal of each driver transistor to form a series connection. The bonded wafers are then singulated to form thousands of modules at a time. In another embodiment, the LED and driver transistor are grown over each other as epitaxial layers, or the driver transistor may be formed by diffusion or implantation of dopants. The modules are extremely compact since the footprint may be approximately the same as a single conventional LED die (e.g., 0.5 mm$^2$-1 mm$^2$).

In one embodiment, the LEDs are screen printed on a wafer. Printable LEDs may be formed with a top surface area range of between 50-5000 um$^2$, allowing the modules to have the same top surface area.

In a large lighting system using hundreds of medium power LEDs, it would be impractical to provide a conventional drive circuit for each of the LEDs. For such white light sources, many LEDs are typically connected in series, and a high voltage is connected across the string. In the prior art, providing such a high voltage sometimes requires a step up regulator, adding cost to the system. The present invention inherently provides each LED with its own driver, allowing many LEDs, even of different colors, to be connected in parallel so that they may be driven with a low voltage (e.g., 5 volts). Providing each LED with its own driver also enables each LED to be controlled to output a desired brightness despite process variations, changes in brightness with temperature, and changes in brightness with age.

Various module embodiments are described along with various addressable arrays of LED modules that are suitable for LED displays or white light sources.

In one embodiment, the packaging for the module is formed by printing.

BRIEF DESCRIPTION OF DRAWINGS

FIG. 3 is a simplified cross-sectional view of a single singulated module.

FIG. 4 illustrates various ways to apply fixed voltages and variable control voltages to the three terminals of the module in FIG. 3, depending on the position of the LED and the type of driver transistor used.

FIGS. 5 and 6 illustrate the LED and driver transistor being formed by growing epitaxial layers.

FIGS. 24-38 illustrate various 2-terminal LED modules.

FIG. 24 illustrates a resistor in series with an LED for setting a current through the LED.

FIG. 25 illustrates a variable resistor in series with an LED for adjusting a current through the LED.

FIG. 26 illustrates a voltage clamp or regulator in series with an LED.

FIG. 27 illustrates a current limiter or regulator in series with an LED.

FIGS. 28, 29, and 30 illustrate different voltage clamps across the LED.

FIGS. 31 and 32 illustrate current regulators and clamps being formed using transistors and resistors.

FIGS. 33 and 34 illustrate current regulators and clamps being formed using transistors, resistors, and diodes.

FIG. 35 illustrates a current source using two transistors.

FIG. 36 illustrates a voltage source using two transistors.

FIG. 37 illustrates a series current source using two transistors.

FIG. 38 illustrates 2-terminal RGB LED modules connected in parallel for a color pixel, including a white light pixel.

Elements that are the same or similar in the figures are labeled with the same numeral.

DETAILED DESCRIPTION

Figure 1:
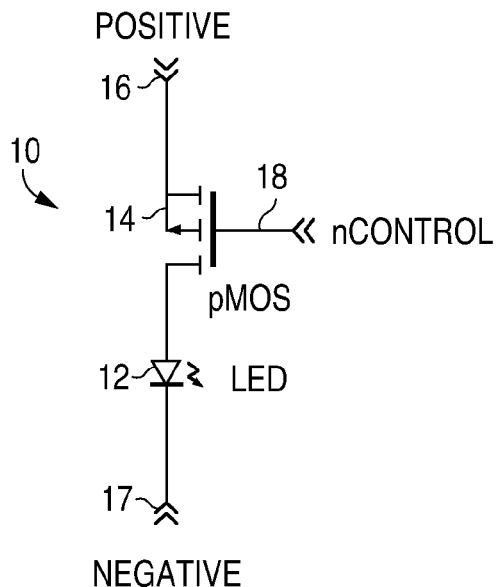
FIG. 1 is a schematic of a single LED module in accordance with one embodiment of the invention.

FIG. 1 illustrates the circuitry in a 3-terminal LED module 10. The module 10 is formed as a single die, singulated from a wafer. The module 10 contains an LED 12 and a PMOS driver transistor 14 with its source and drain in series with the LED 12 to control the current through the LED 12. The drain-source impedance adds to the impedance of the LED 12. Therefore, the total series impedance can be control by modulating the gate of the transistor 14. In this manner the transistor 14 performs a variable resistance or switching behavior. As such, forward current can only flow if the gate is biased beyond the PMOS transistor turn-on threshold. The module 10 may be packaged to have only three terminals 16, 17, and 18.

Other configurations of a single transistor, active LED are possible, as described later. The selection of a particular configuration of the LED and transistor and the particular type of transistor depends on the control requirements or constraints of the application.

Figure 2:
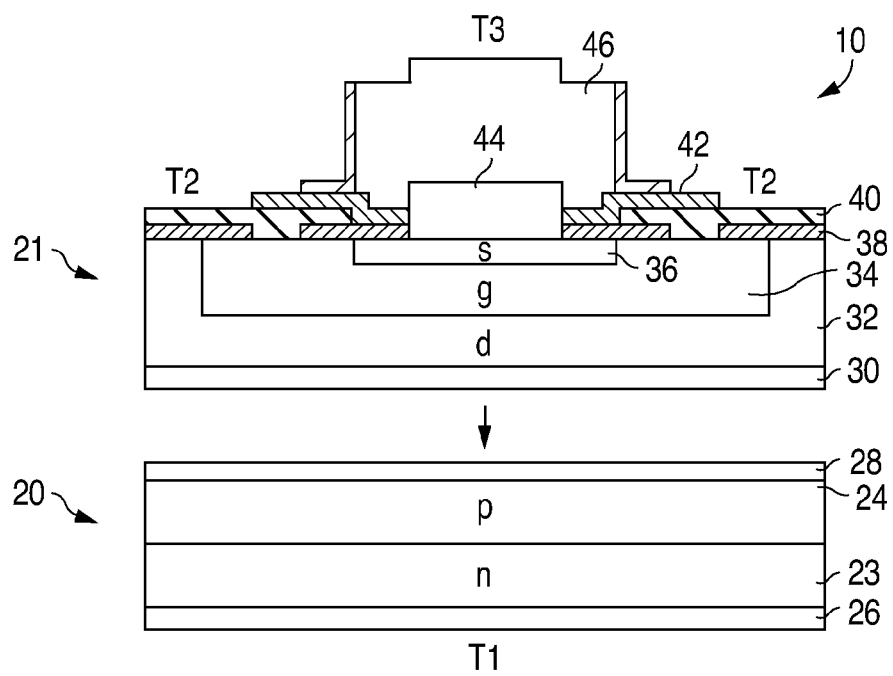
FIG. 2 is a cross-sectional view of a small portion of an LED wafer being bonded to a driver transistor wafer.

FIG. 2 illustrates one embodiment of the structure of the module 10. FIG. 2 illustrates small portions of two wafers 20 and 21, which may be formed using different materials and technologies.

Wafer 20 is an LED wafer containing thousands of vertical LEDs. For blue light, the material system may be AlInGaN, where the stoichiometry determines the peak emission wavelength. Forming such LEDs is well known. The blue LED may be eventually covered with a phosphor to produce any color. The LED wafer 20 may instead use other material systems to achieve a wide range of peak wavelengths from green to red. The LEDs may include a multi-well active layer, as is well known. The wafer 20 is shown very simplistically since forming LEDs is conventional. Basically, an n-type epitaxial layer 23 and a p-type epitaxial layer 24 are grown over a growth substrate (e.g., sapphire, SiC, or GaAs). Light is generated at the pn interface. An active layer may be formed at the interface. The growth substrate should be removed if highly resistive or light absorbing. The n-type epitaxial layer 23 may also be thinned.

In one embodiment, the bottom surface of the LED wafer 20 is coated with a transparent conductor layer, such as a thin gold layer, to make ohmic contact to the layer 23 and spread current. Each LED portion has at least one metal electrode forming terminal T1. The metal electrodes may be formed as thin fingers, asterisk-shaped, or otherwise take up a small area so as not to block a significant amount of light in the downward direction. In another embodiment, the bottom surface of the LED wafer 20 is coated with a reflector layer so that light is only emitted from the sides or top of each singulated LED.

The bottom layer 26 in FIG. 2 represents any form of bottom conductor, including those described above. In the example, the bottom conductor is a cathode conductor, but in some embodiments, the bottom conductor is an anode conductor.

The top surface of the LED wafer 20 is prepared for being bonded to the bottom surface of the wafer 21 to form a substantially ohmic contact. In one embodiment, the top surface of wafer 20 is a very flat reflective metal layer 28 that is bonded to a similar metal layer 30 on wafer 21 by pressure and heat. In another embodiment, the joining surfaces of the wafers 20 and 21 may be by a proprietary process performed by Ziptronix, Inc., such as described in U.S. Pat. No. 7,842,540, incorporated herein by reference. The LED wafer 20 may have any diameter, such as 3-8 inches. A suitable voltage applied between the top and bottom surfaces of the LED wafer 20 will cause the LEDs to emit light.

The top wafer 21 forms vertical p-channel MOSFETs associated with each LED portion in the LED wafer 20. There will typically be thousands of LEDs and MOSFETs formed in a wafer. The wafer 21 may use a p-type silicon substrate in which is formed, by conventional photolithographic techniques, a p-type drain well 32, an n-type gate 34, and a p-type source 36. Each drain well 32 may have a square shape coinciding with the singulation edges of the modules.

The various dielectric layers and metal electrodes over the wafer 21 may be formed by printing or by using conventional vacuum chamber techniques. If printing is used, such as screen printing, a dielectric layer 38 is formed with openings over the gate 34 and source 36. A first metal layer 40 is then printed, using a screen for masking, in the openings to contact the gate 34 and source 36. The first metal layer 40 may be an ink containing metal (e.g., Ni, Ti, Al, etc.) particles and a solvent. When the ink is cured, the solvent evaporates and the metal particles are sintered together. Another dielectric layer 42 is printed with openings over the source 36 metal and gate 34 metal. An additional metal layer 44, such as aluminum, is printed over the source 36 metal, followed by a thick source electrode layer 46. The metal layers may include a barrier layer. The terminals T2 and T3 in FIG. 2 are designed for a particular type of packaging and array of modules, described later. The terminals T2 and T3 may be designed differently depending on the application and packaging.

The various dielectric and metal layers over the wafer 21 may be formed after the wafers 20 and 21 are ohmically bonded together to avoid damage to the conductors.

Printable LEDs may be formed with a top surface area range of between 50-5000 um$^2$, allowing the modules to have the same top surface area. For very small LED sizes, etching is the preferred method for singulation.

The bonded wafers 20 and 21 are then singulated using conventional techniques such as etching, sawing, scribing-and-breaking, laser, etc.

FIG. 3 illustrates a simplified singulated LED module 10. In one embodiment, the size (footprint) of the module 10 is about 0.1 mm$^2$-1 mm$^2$. The terminal T1 is shown taking up a small portion of the bottom surface of the module 10 to allow light to escape from the bottom surface.

To control the module 10 of FIG. 3 to emit light, assuming the configuration of FIG. 1, a positive voltage is applied to the source terminal T3, a negative voltage is applied to the cathode terminal T1, and a gate-source voltage (Vgs) exceeding the MOSFETs threshold is applied to the gate terminal T2. In one embodiment, to forward bias the LED, the voltage differential across terminals T3 and T1 is greater than 2 volts. For a blue LED 12, the required voltage differential may be greater than 4 volts.

FIG. 4 identifies various ways to control an LED module, depending on the position of the LED and the type of MOSFET used. For example, instead of controlling the MOSFET by controlling its gate voltage, the gate voltage may be fixed (positive) and the source voltage may be controlled to achieve the desired Vgs. Other configurations of LEDs and current/voltage controlling transistors are shown in FIGS. 8-15, described later.

An advantage to using wafer bonding to bond the LED portion to the transistor portion is that different materials (e.g., Si and GaN) for the two wafers may be used. In the event that the LED and the transistor can be based on the same material (e.g., GaN or GaAs), the LED layers and transistor layers may be epitaxially grown over the same growth substrate. In one embodiment, a well-known type of GaAs or GaN-based transistor, known as a high electron mobility transistor (HEMT), a heterostructure FET (HFET), a metal-semiconductor FET (MESFET), or a modulation-doped FET (MODFET), is grown over a growth substrate (e.g., GaAs, GaN, SiC, sapphire, etc.) following or followed by an AlInGaP or AlInGaN LED generating blue to red light. The growth substrate may be removed if highly resistive or absorbs light.

FIG. 5 illustrates an example where the growth substrate 50 has grown over it the LED layers 52, followed by the transistor layers 54. The dielectric and metal layers over the top surface of the LED module 56 may be similar to those layers in FIG. 2. If the substrate 50 is conductive, such as SiC, it may be left on the module. Light may exit either the top surface, the bottom surface, or the side surface, depending on the materials and the application.

FIG. 6 illustrates an example where a growth substrate has grown over it the LED layers 52 and the transistor layers 54. The growth substrate is then removed and a metal electrode (not shown) is formed over the exposed surface of the LED layers 52. The dielectric and metal layers over the transistor may be similar to those layers in FIG. 2. Light then may exit from the bottom surface of the LED layers 52 opposite to the transistor surface.

FIG. 6 may also illustrate an example where the transistor layers 54 are grown on a substrate wafer and the LED layers 52 are then grown over the transistor layers 54. The transistor layers 54 thus act as the growth substrate for the LED layers 52. In one embodiment, the growth substrate may be a conventional substrate for growing GaN layers, such as sapphire, SiC, GaN, silicon, etc. The transistor layers 54 may be one or more GaN layers for a FET, as described above. The LED layers 52 are then grown to create a conventional GaN-based heterojunction LED that emits blue light. The growth substrate is then removed, such as by using laser lift off or grinding to expose the transistor layers 54. The transistor layers 54 may then be thinned. In one embodiment, the transistor layers 54 are n-type GaN layers, and, after the substrate is removed, the n-type surface of the transistor layers 54 is then subjected to conventional photolithographic masking and doping processes (e.g., by diffusion or implantation) to form a p-type gate region and n-type source regions shown in FIG. 2. The dielectric and metal layers shown in FIG. 2 may then be printed to create the transistor structure shown in FIG. 2.

In another embodiment represented by FIG. 6, the transistor is a heterojunction type and the layers 54 may be grown as an n-type source layer, a p-type gate layer, and an n-type drain layer. Opposite conductivities may be used. The LED layers 52 are then grown over the top layer of the transistor layers 54. After the growth substrate is removed, the semiconductor layers may be etched and metal layers deposited to electrically contact the various layers in the transistor. The dielectric and metal layers shown in FIG. 2 may then be printed to complete the FET structure. Other types of transistors may be formed integral with the LED layers 52. Forming GaN-based transistors is conventional.

The resulting wafer is then singulated to form many thousands of individual LED modules 10 at a low cost.

By growing the LED layers 52 and transistor layers 54 to form an integral structure, any voltage drop across a bonded barrier (like in FIG. 2) is avoided and efficiency is improved. Fabrication cost is also much less compared to the bonded structure of FIG. 2.

Figure 7:
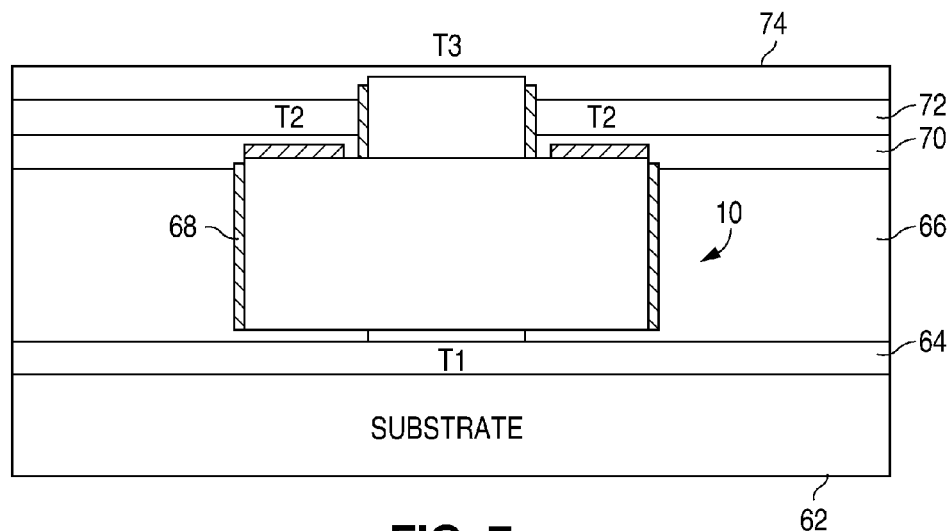
FIG. 7 illustrates a singulated module die after packaging, such as in a panel.

FIG. 7 illustrates the module 10 packaged to encapsulate it and to provide conductors for applying power and control signals to the module 10. The encapsulated module 10 may form part of a display panel in which many modules are encapsulated in the same panel. In FIG. 7, a substrate 62 is provided, such as a transparent plastic or glass panel, with a metal conductor 64 for direct bonding to the terminal T1 of the LED module 10. In a panel, there may be many conductors 64 connected to various LED modules in an array, or a single conductor sheet may connect the LED modules in parallel. The metal conductor 64 is ultimately connected to a power terminal. Light from the LED may be emitted downward through the substrate 62. The metal conductor 64 may have a metal pad for bonding to the terminal T1. The metal conductor 64 may also include a transparent conductor portion. A dielectric layer 66 is then screen printed over the substrate 62 to encapsulate the sides of the module 10. The dielectric layer 66 may also encapsulate other modules supported by the substrate 62.

The module 10 may have a reflective film 68 formed on its sides prior to encapsulation to prevent side light emission, or the dielectric layer 66 may be reflective, such as white. The film 68 may also represent a dielectric coating if needed. Alternatively, side light from the LEDs is reflected upward and downward by the dielectric layer 66, such as where the dielectric layer 66 contains white titanium oxide particles. In such a case, the substrate 62 may be reflective so all light ultimately exits through the top surface of the panel.

A second metal conductor 70 is formed over the MOSFET and dielectric 66 to contact the gate terminal T2. A dielectric layer 72 is formed over the metal conductor 70, and a third metal conductor 74 is formed over the dielectric layer 72 to contact the source terminal T3. In one embodiment, the metal conductors 64, 70, and 72 are narrow column and row lines of an addressable LED panel, such as a color display or a white light source.

In most cases, the dielectric layer 66 will be much thicker than the dielectric layer 72. The thin dielectric layer 72 is suitable for separating the conductors 70 and 74 if the conductors 70 and 74 conduct the positive and control voltages for a PMOS transistor, since leakage between these two conductors would not be a concern. Thus, the terminal T1 should be the negative voltage terminal. The selection of which of terminals T2 or T3 should be the positive voltage terminal and which should be the control terminal depends on the application. Typically the top conductor 74 will be lower resistivity than the middle conductor 70. As such, a good choice for terminal T3 would be the higher current positive voltage terminal.

The panel may include many thousands of LED modules 10 of various colors, such as the primary red, green, and blue, or other colors, such as yellow and white. All LEDs may be blue LEDs, with the red and green colors being formed by red and green phosphors. If the panel is a white light panel to be used for general illumination or as a backlight for an LCD, each LED may be a blue LED coated with a phosphor that adds green and red components to form white light. The panel may be on the order of 2 mm thick and be any size. The various LEDs may be connected in any configuration, such as series, parallel, or a combination to achieve the desired voltage drop and current.

Light may be emitted from the packaged module 10 in various ways. If the transistor wafer 21 is transparent to visible light, the conductors 70 and 74 are transparent or narrow, and the bonded interface between the wafers 20 and 21 is transparent, the LED light may be emitted through the top surface in the orientation of FIG. 7. A transparent wafer 21 may be SiC or GaN, and the transistor may be a well-known GaN HEMT, MOSFET, or MESFET. The bottom conductor 64 and the substrate 62 may be reflective.

Alternatively, the light may be emitted through the bottom of the package, where the conductor 64 is thin or transparent and the substrate 62 is transparent. The wafer bonding interface may be a reflective metal.

Alternatively, all LED light may be transmitted through the side walls of the LED, then reflected upward or downward through the top or bottom surface of the package. The wafer bonding interface may be a reflective metal. The dielectric layer 66 may be diffusively reflective to reflect the light upward and downward. The conductors 70 and 74 may be narrow or transparent if light is to be emitted through the top surface. The conductor 64 and substrate 62 may then be reflective. For bottom surface transmission, the conductors 70 and 74 may be reflective, the conductor 64 is narrow or transparent, and the substrate 62 is transparent.

In a module (such as the single die module of FIG. 3), the control transistor may be connected as a high side transistor or a low side transistor, and the transistor may be a MOSFET, a bipolar transistor, or any of the other types of transistors mentioned herein. All of the transistor types are formed as vertical transistors. FIGS. 8-15 illustrate some of the possible configurations. Forming all of the vertical transistor types is well-known.

Figures 8, 9, 10, 11:
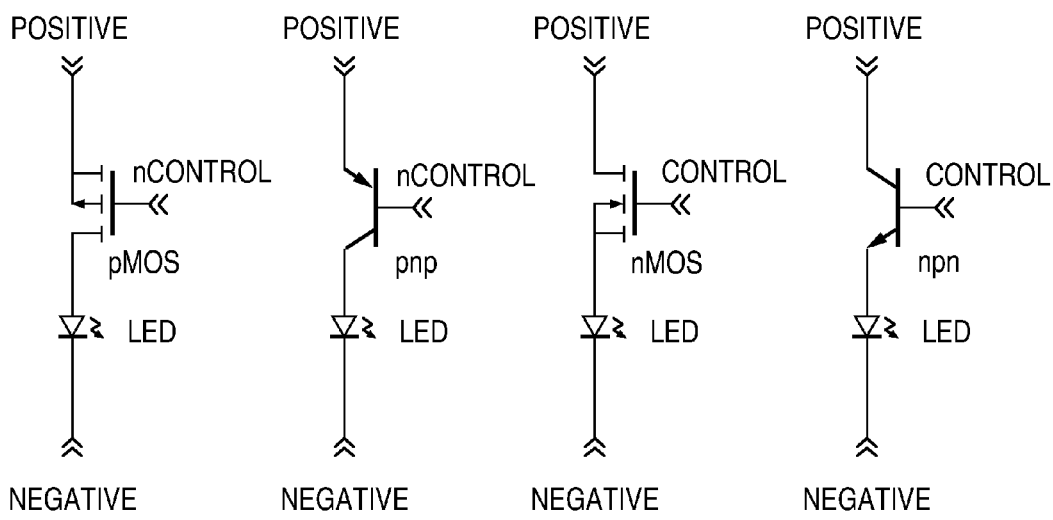
FIG. 8 illustrates a PMOS driver transistor connected to the anode of an LED.
FIG. 9 illustrates a pnp bipolar driver transistor connected to the anode of an LED.
FIG. 10 illustrates an NMOS driver transistor connected to the anode of an LED.
FIG. 11 illustrates an npn bipolar driver transistor connected to the anode of an LED.

FIG. 8 is identical to FIG. 1.

FIG. 9 uses a high side pnp bipolar transistor as the control transistor.

FIG. 10 uses a high side n-channel MOSFET as the control transistor.

FIG. 11 uses a high side npn bipolar transistor as the control transistor.

Figure 12:
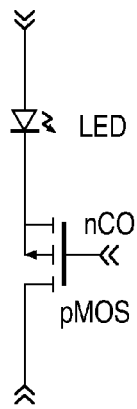
FIG. 12 illustrates a PMOS driver transistor connected to the cathode of an LED.

FIG. 12 uses a low side p-channel MOSFET as the control transistor.

Figure 13:
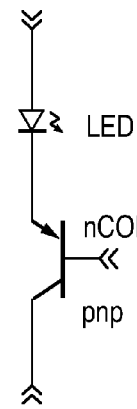
FIG. 13 illustrates a pnp bipolar driver transistor connected to the cathode of an LED.

FIG. 13 uses a low side pnp bipolar transistor as the control transistor.

Figure 14:
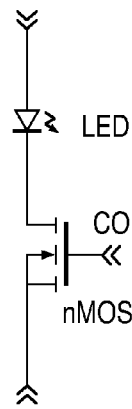
FIG. 14 illustrates an NMOS driver transistor connected to the cathode of an LED.

FIG. 14 uses a low side n-channel MOSFET as the control transistor.

Figure 15:
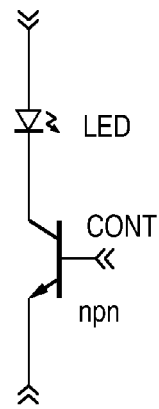
FIG. 15 illustrates an npn bipolar driver transistor connected to the cathode of an LED.

FIG. 15 uses a low side npn bipolar transistor as the control transistor.

The circuitry formed in the wafer 21 (FIG. 2) for each singulated LED module may include multiple transistors and other components, such as resistors, interconnected in any manner. Each LED module may also include multiple LEDs interconnected with the components formed in the wafer 21. The interface bonding the LED wafer and the "electronics" wafer may include an electrode pattern that creates multiple conductive paths between the LEDs and the components in the electronics wafer. For example, an electrode pattern formed on the top of the LED wafer may correspond to an electrode pattern formed on the bottom of the electronics wafer for creating a mechanical bond and for providing a certain electronic interconnection. An adhesive may also be used to additionally mechanically bond the wafers.

Figure 16:
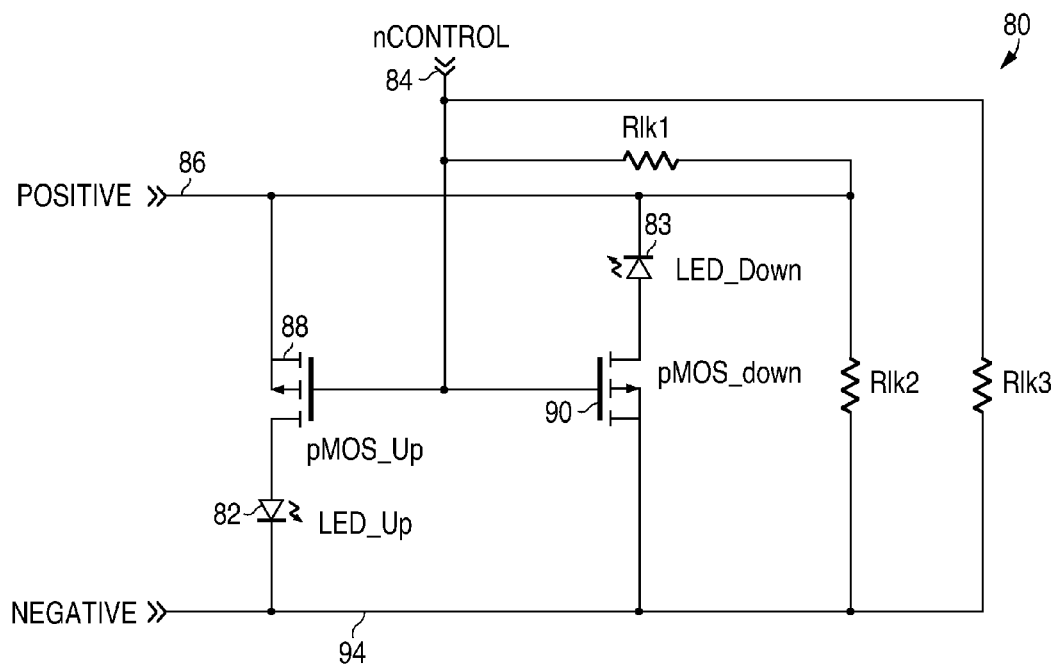
FIG. 16 illustrates an anti-parallel arrangement of LEDs used for transient voltage suppression.

The issues involving a high density arrangement of LED modules employing thin dielectric layers and thin conductors may be complex. For example, the leakage between printed conductive layers will create parasitic current paths that could either enhance or degrade controllability. Possible parasitic resistances due to leakage are illustrated in the circuit of FIG. 16 as Rlk1, Rlk2, and Rlk3. The circuit 80 of FIG. 16 may be a small portion of a display panel where anti-parallel connected modules are packaged close together to form a pixel for a single color.

The "upward facing" LED 82 is intended to be controlled to emit light for the display panel, and the "downward facing" LED 83 is intended to provide reverse voltage transient protection of the LED 82 by shorting the terminals 86 and 94 in the event of a high reverse transient voltage. In a simple addressing scheme, only the LED 82 is intended to be lit. When a row is not selected, the associated LEDs (e.g., LED 82) are biased at sub-threshold or possibly reversed biased. The anti-parallel LEDs (e.g., LED 83) are problematic if the un-selected rows are reversed biased, which forward biases those LEDs, causing them to emit light and reducing the light-to-dark contrast of the array.

In FIG. 16, the LED 82 emits light when the gate control terminal 84 is a threshold voltage below the positive voltage applied to terminal 86, so that the MOSFET 88 is on. At this time, the MOSFET 90 and LED 83 are off. Resistance Rlk1 represents the leakage between the terminal 84 and the positive voltage terminal 86. This leakage is beneficial since it provides a weak pull-up for both p-channel MOSFETs 88 and 90, turning the MOSFETs 88 and 90 off (and the LEDs 82 and 83 off) as a default, uncontrolled state. The leakage between positive voltage terminal 86 and the negative voltage terminal 94, represented as Rlk2, causes power loss and hence lowers power efficiency; however, Rlk2 is a high resistance. The leakage between the control terminal 84 and the negative voltage terminal 94, represented as Rlk3, is a weak gate pull-down for MOSFET 88 and thus degrades the controllability of the LED 82. Rlk3, however, causes some tracking between the gate and source of MOSFET 90 so it is beneficial for turning off the LED 83.

As seen, issues of parasitic resistances should be taken into account in high density applications. Parasitic capacitances may also be taken into account.

Figure 17:
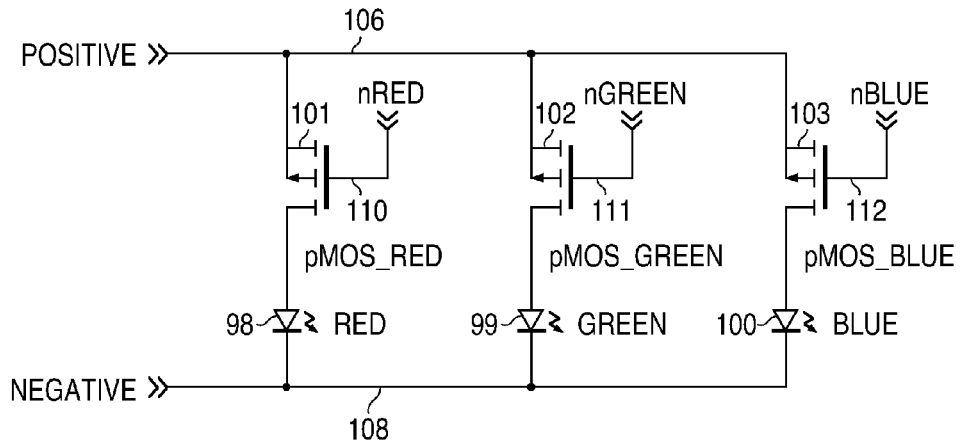
FIG. 17 illustrates RGB LED modules connected in parallel for a color display or a white light.

FIG. 17 illustrates circuitry in a single package containing at least three LED modules. The package may be a display panel containing an array of addressable LEDs. One module includes an LED 98 that emits red light, one module includes an LED 99 that emits green light, and one module includes an LED 100 that emits blue light. The LEDs 98 and 99 may be phosphor coated blue LEDs. The modules include p-channel MOSFETs 101, 102, and 103, similar to FIGS. 1 and 2. The package includes conductors 106 (e.g., X-address lines) that electrically connect the sources together and conductors 108 (X-address lines) that connect the LED's cathodes together so that the modules are connected in parallel. Each LED is controlled by a separate control voltage applied to the gate of its respective MOSFET by conductors 110-112 (e.g., Y-address lines). In this way, any color light, including white, may be generated by the package. The three modules may form a single color pixel in a display or may be part of a white light panel.

The advantage of the integrated modules, when controlling different color LEDs connected in parallel, is that the modules can have two common terminals connected to the positive and negative voltages, with the third terminal selecting a single LED at a time. By only turning on one color LED at a time, its forward voltage does not affect the voltage across the other LEDs. For example, if the control voltages were all pulled low concurrently, the low forward voltage of the red LED 98 would prevent the green and blue LEDs from turning on. As long as only one LED color is active at a time, then there is no conflict between different forward voltages. The turn-on duration of the different LED colors can be divided in time (time division multiplexing), and the control voltage level can be adjusted for the active LED forward voltage. In one embodiment, the control voltages applied to the gates of the MOSFETs 101-103 are provided sequentially at a frequency above about 60 Hz, where the relative duty cycles of the control voltages control the perceived color of light.

Figure 18:
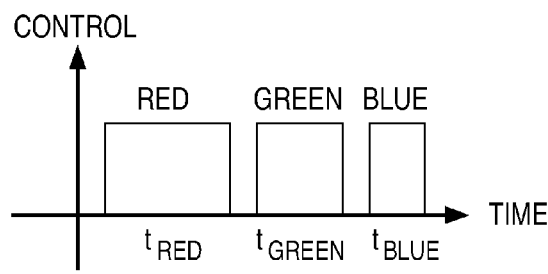
FIG. 18 illustrates how the RGB LEDs in FIG. 17 may be sequenced using the control voltage to create any color, including white light.

FIG. 18 is an example of the relative on-times of the red, green, and blue LEDs 98-100 in a single cycle for controlling the light emission from the three modules. The control voltages may be different for each color LED to cause the respective LED to emit a certain predetermined flux level (e.g., a nominal maximum brightness), whereby any overall brightness level and color, including white or neutral light, can be achieved by controlling the absolute on-times (for brightness) and the relative on-times (for color) per cycle.

Figure 19:
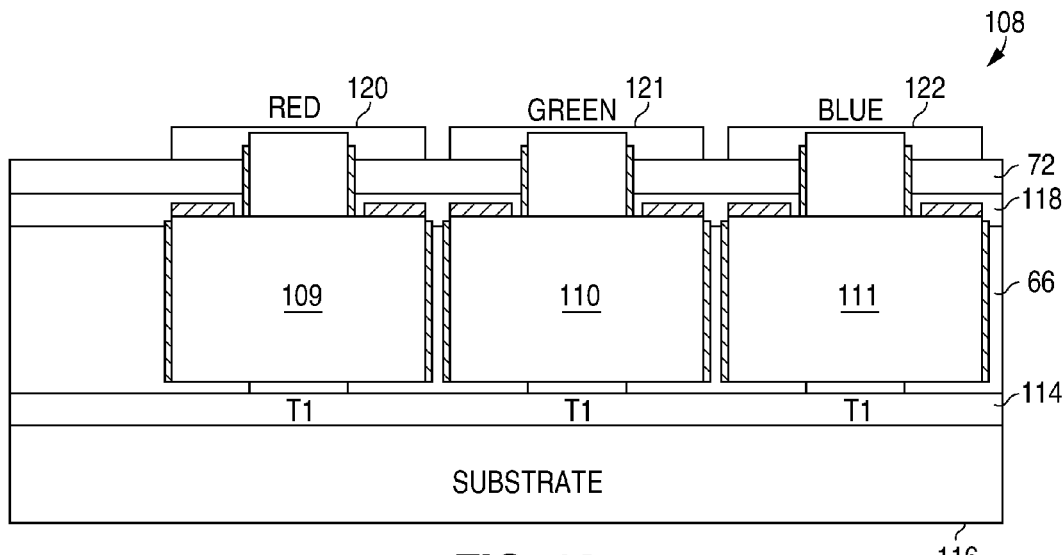
FIG. 19 illustrates separate RGB LED modules packaged together, such as in a color display.

FIG. 19 illustrates a package 108 containing three LED modules 109, 110, and 111. The package may be an entire panel of addressable LEDs, and FIG. 19 may just illustrate a small portion of the panel. Module 109 contains a red LED, module 110 contains a green LED, and module 111 contains a blue LED. In the example of FIG. 19, the cathode terminals T1 of the LEDs are connected together by the conductor 114, supported by the substrate 116. The direction of light emission from the package 108 may be any of those directions discussed with respect to FIG. 7. The transistors in the modules 109-111 are p-channel MOSFETs, where a gate voltage sufficiently below the source voltage turns on the transistor and LED. The gates of the transistors are connected in common by the conductor 118, and the sources of the transistors are separately contacted by conductors 120, 121, and 122, extending into and out of the drawing page. The voltage across the conductors 114 and 118 is higher than the forward voltage of any of the LEDs. By individually controlling the source voltages in a time-division fashion, the respective transistors can be separately controlled to conduct any current to control the mix of the RGB colors.

The dielectric layers 66 and 72 may be the same as in FIG. 7.

Alternatively, the sources of the transistors in FIG. 19 may be connected together by a conductor replacing conductors 120-122, and the gates are separately contacted by conductors replacing the common conductor 118 to allow individually controlling the transistors via the gate voltage.

In one embodiment, the structure of FIG. 19 represents a single 3-module package with five terminals. In another embodiment, the structure of FIG. 19 is only a portion of a much larger panel having a single substrate 116, where each color pixel location contains the three RGB modules. The dielectric 66 may be a single dielectric layer encapsulating all the modules on the panel. The pixels in a row may be addressed by applying a voltage across row (X) conductors 114 and 118, and the individual LEDs at any pixel location in an addressed row may be turned on by applying a suitable control voltage to the column (Y) conductors 120-122. Many modules in a column may receive the same control voltage, but LEDs in a non-addressed row will not turn on.

Figure 20:
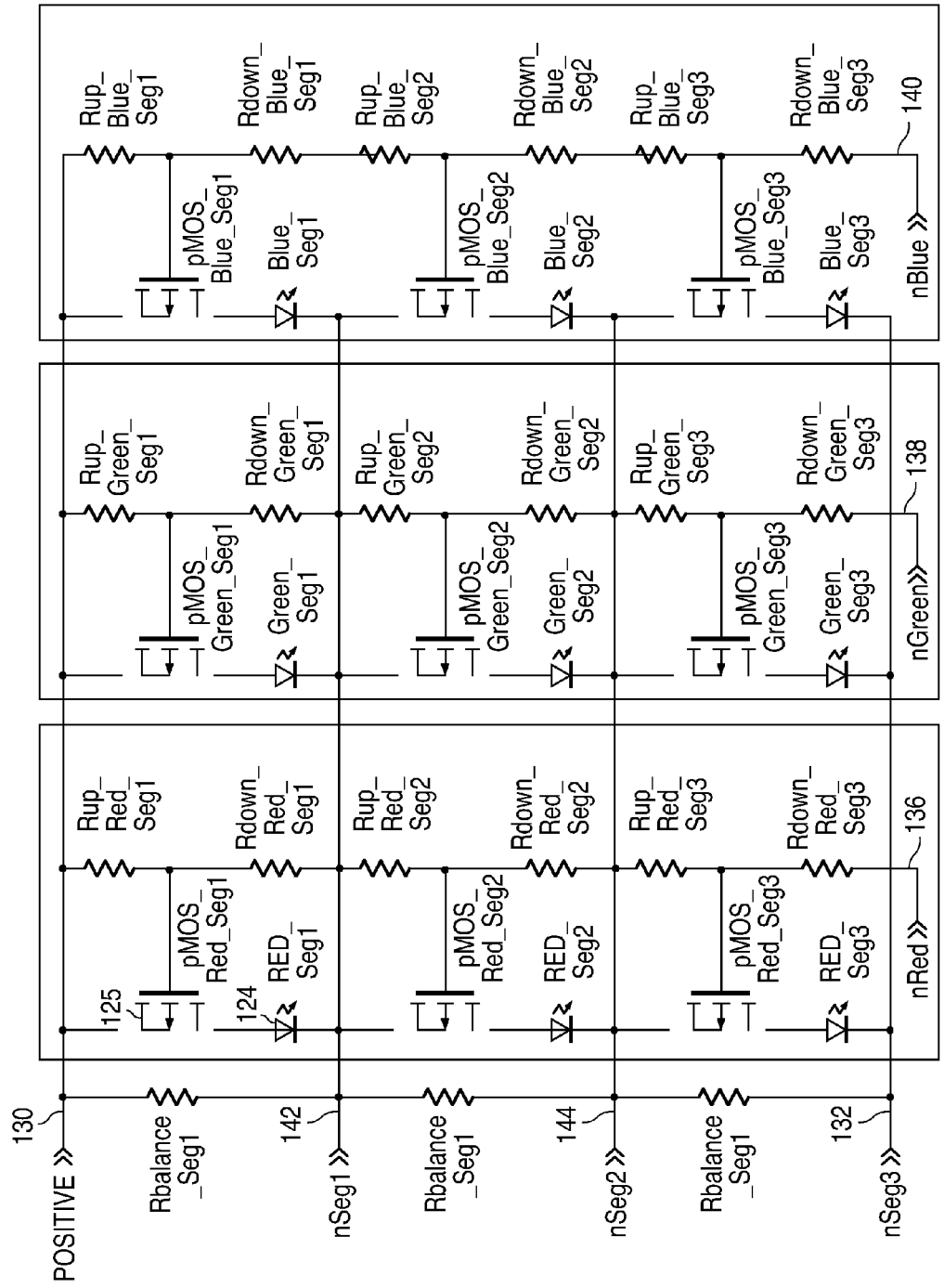
FIG. 20 illustrates an addressable network of RGB LED modules, using row and column addressing.

In high power (>0.1 W/in²) lighting applications (including backlighting an LCD) where many LEDs can be on at the same time, it is advantageous for a given power to increase the operating voltage and reduce the current. Power losses in the printed interconnects are proportional to the square of the current; therefore efficiency can be increased by connecting multiple LED segments in series, which sum to a larger voltage but lower current. FIG. 20 illustrates a light panel having multiple segments of parallel RGB LEDs (in rows) connected in series (in columns). The panel may be much larger. Each combination of LED 124 and p-channel MOSFET 125 is a single module, formed in any of the manners described above.

In one example of the use of the panel of FIG. 20, white light is created as follows. A positive voltage (e.g., 15 volts) is applied to the conductor 130 and a negative voltage (e.g., ground) is applied to the conductor 132. Since the maximum forward voltage of any one of the LEDs is assumed to be 4 volts, and there are three LEDs in series, 15 volts is sufficient to drive each string. In the example of FIG. 20, the red LEDs are in the leftmost column, the green LEDs are in the center column, and the blue LEDs are in the rightmost column. All red LEDs in the column are controlled by the same red control voltage applied to the conductor 136, all green LEDs in the column are controlled by the same green control voltage applied to the conductor 138, and all blue LEDs in the column are controlled by the same blue control voltage applied to the conductor 140. The control voltage magnitudes may be different to achieve the desired current through each column of LEDs. The control voltages are applied in sequence and at a duty cycle, such as shown in FIG. 18, in order to achieve the desired overall color output. A resistor divider along the conductors 136, 138, and 140 causes each MOSFET in a column to have the same Vgs. Another resistor divider between conductors 132 and 130, formed of high value resistors, ensures that each row of modules has the same voltage across it when the LEDs are off so all MOSFETs in a column will turn on at the same time.

The light from the RGB LEDs will be mixed only a few millimeters from the face of the panel and/or a diffuser panel may be used to improve the uniformity of light.

Instead of using a resistor divider between conductors 130 and 132, a separate voltage may be applied to each of the X conductors 130, 134, 142, and 144 to apply 5 volts across each row.

Many small panels may be connected together to form a single large panel. The small panels may be connected in any combination of series and parallel, depending on the desired voltages and currents, or each panel may be separately driven by its own power supply. In one embodiment, the panel creates a 2×4 foot ceiling panel (a lamp) for general illumination.

In another embodiment, the panel of FIG. 20 may be a color display. For a color display, the resistor divider between the conductors 130 and 132 is eliminated, and a single row of modules is addressed at a time by providing a voltage of, for example, 5 volts, across the row. Then, a control voltage is applied to the conductors 136, 138, and 140 in sequence to generate an RGB color for a single color pixel. The display may be any size.

If the panel of FIG. 20 is to be used for general lighting, there is no need for row addressing, and the columns of series red, green, and blue LEDs are just addressed in a rapid time division repeating pattern by applying control voltages to the conductors 136, 138, and 140 to turn on the various MOSFETs. To the human eye, the colors blend together without flicker. Either the on-time per color, the particular number of LEDs in a series, or the control voltage per color may be selected to generate the desired perceived color (e.g., white point). The emitted color may be controlled to be selectable by the user.

Figure 21:
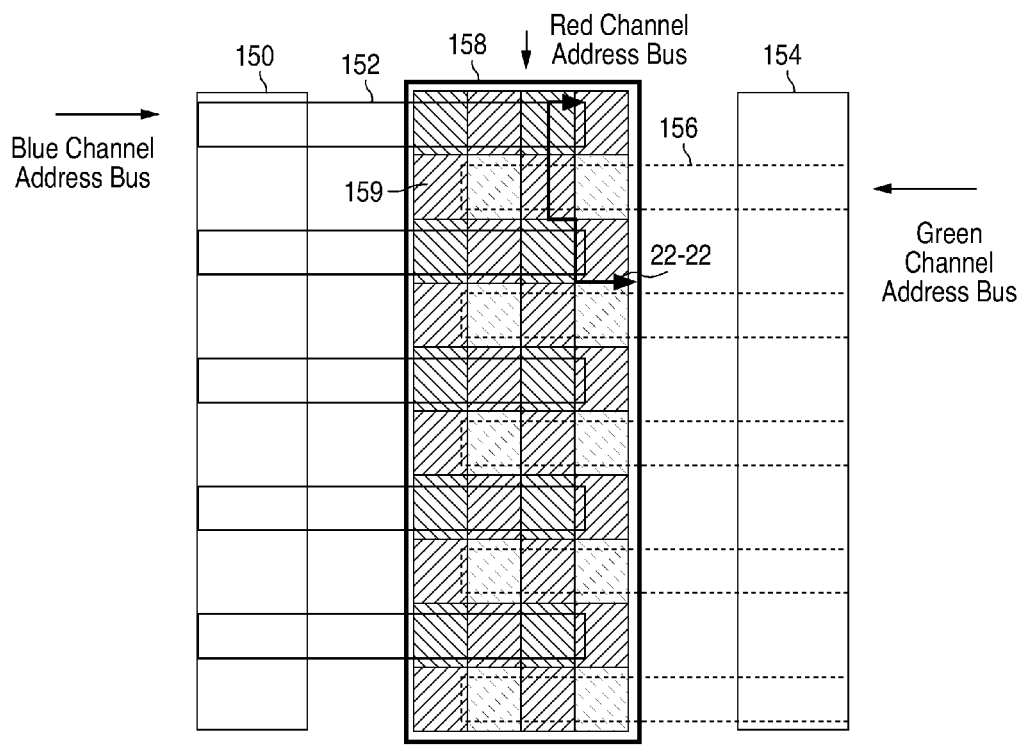
FIG. 21 illustrates an addressing scheme for an array of RGB LED modules.

For a lighting panel (as opposed to a color display with addressable pixels), convergence of the individual RGB elements is important to reduce visual nuisances of unmixed color. Therefore it is necessary to pattern the individual LEDs colors in a regular pattern that will converge into the desired color within a particular diffusion length. Secondly, for warm white colors, considerably more red power is needed than green and blue. A two level RGB array having a regular pattern and twice as many red LEDs as green and blue LEDs is shown in FIG. 21. FIG. 21 illustrates an addressing scheme for the RGB LEDs in a lamp for general illumination. The two level interconnect separates the red control conductor from the green and blue conductors. Rows of blue and green LEDs alternate, while red LEDs are between the blue LEDs and green LEDs in each row.

In FIG. 21, the cathodes of all the LEDs in the panel are connected to a common ground conductor, and the gates of all the transistors (e.g., p-channel MOSFETs) are connected to a common positive voltage conductor. Accordingly, the source voltages will be controlled to control the current through the LEDs. A blue channel address bus 150 couples the blue X conductors 152 to the sources of the transistors for the blue LEDs. A green channel address bus 154 couples the green X conductors 156 to the sources of the transistors for the green LEDs. The address busses 150 and 154 may be connected together if the blue and green LEDs use approximately the same forward voltage. A red channel address bus 158 is wide and is coupled to the sources of the transistors for the red LEDs. Accordingly, the overall color output by the panel is controlled by the voltages applied to the three address busses 150, 154, and 158 and the duty cycles of the control voltages. An array of red, green, and blue LED modules 159 connected to the conductors and busses populates the panel. The number and types of the red, green, and blue LEDs may be selected to achieve the optimal efficiency of the panel.

Figure 22:
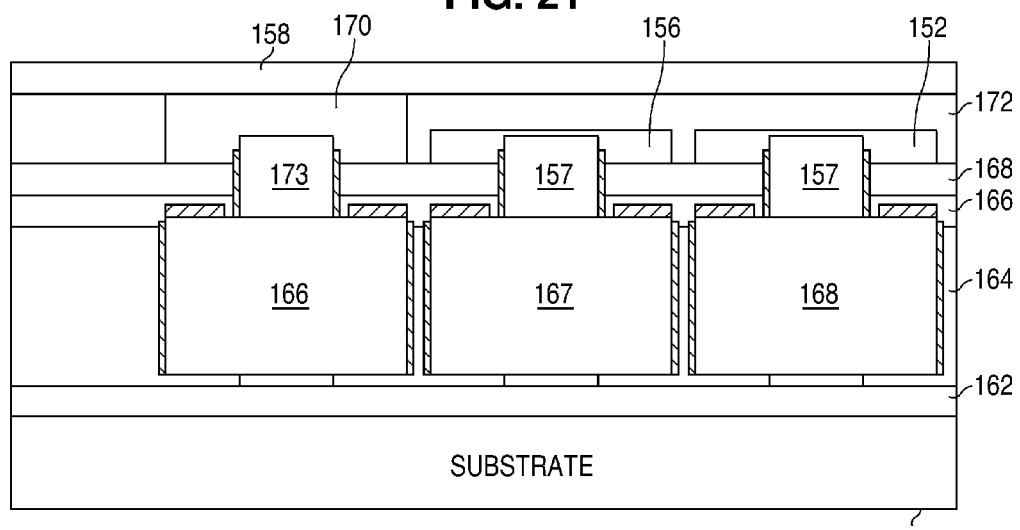
FIG. 22 illustrates a packaging configuration for RGB LED modules for use in the network of FIG. 21.

FIG. 22 shows a jagged cross-sectional view along line 22-22 in FIG. 21 of a small portion of the two level RGB array panel of FIG. 21 showing a set of RGB LED packaged modules. All dielectric layers and conductor layers may be formed by printing.

In FIG. 22, the substrate 160 may be a transparent plate. A ground (or negative voltage) conductor 162 supported on the substrate 160 is connected to the cathode terminals of the red module 166, the green module 167, and the blue module 168. The conductor 162 may be transparent or thin to allow light to be emitted through the substrate 160. A dielectric layer 164 encapsulates the sides of the modules 166-168. A gate conductor 166 is connected to the gates of the MOSFETs in the modules 166-168. A fixed positive voltage (relative to the conductor 162 voltage) is applied to the gate conductor 166. A dielectric layer 168 is formed above the conductor 166. Separate conductors 152 and 156 (extending into and out of the drawing) are connected to the respective source electrodes 157 of the blue and green modules 168 and 167 to separately control the currents to the blue and green LEDs. Each red LED module has a raised source contact 170 that extends above the conductors 152 and 156. A dielectric layer 172 is formed over the conductors 152 and 156 and over the dielectric layer 168. The red channel address bus 158 is then formed over the dielectric layer 172 to contact all the sources 173 of the red LED modules 166. The bus 158 covers the entire array of RGB LED modules and also acts as a reflector. As seen, the resulting panel has two levels of control conductors for separately controlling the currents to the red, green, and blue LEDs. The LEDs in the array of FIG. 21 are connected in parallel, and the different colors of LEDs are controlled in a sequential manner, as previously described. Multiple arrays may be connected together in series and parallel to achieve any size panel having any overall brightness with optimal voltages and currents.

In one embodiment, the conductors 152 and 156 are about 1 mm wide or less. The LEDs may produce pixel sizes of 50 $um^2$-1 $mm^2$. For a white light source, where uniform light across the panel is desirable, the RGB colors are mixed at a height only about 1-2 mm above the panel. A diffuser sheet may also be used. The red, green, and blue LEDs may be energized sequentially at 60 Hz or greater to avoid flicker. The respective duty cycles determine the overall color emitted by the panel.

Alternatively, FIG. 22 may represent a single, packaged RGB lamp forming a single controllable pixel of a color display or for any other application.

Figure 23:
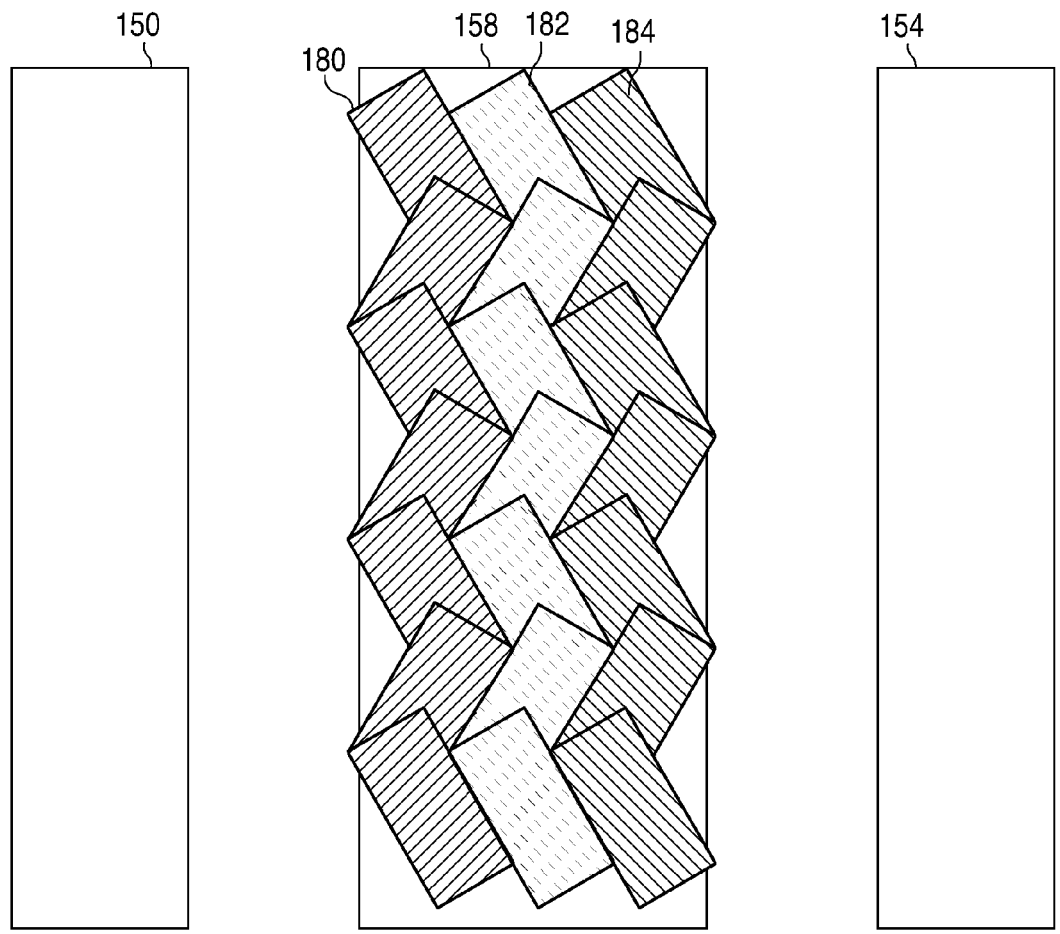
FIG. 23 illustrates a zig-zag arrangement of color LED modules for improved color mixing.

FIG. 23 illustrates a zig-zag arrangement of red, green, and blue LED modules for improved color mixing. In FIG. 23, short diagonal lines of red LED modules 180 are arranged in a zig-zag column. Similarly, short diagonal lines of green LED modules 182 are arranged in a zig-zag column, and short diagonal lines of blue LED modules 184 are arranged in a zig-zag column. An additional red LED module column may be inserted between the green and blue columns to add more warmth to the resulting white light. The zig-zagging of the RGB light better mixes the light for a more uniform white light across the panel. The connections to the RGB LED modules may be the same as described with respect to FIGS. 21 and 22 so are not shown for simplicity.

In some applications, there is a benefit to connect LED modules of the same color in parallel. There may be any number of legs connected in parallel. A string of LED modules may form each leg of the parallel circuit, and each leg may include a different number of LED modules in series. The LEDs in a single leg are energized together and each leg is controlled independently. This technique may be used to adjust the overall brightness (flux) emitted from the parallel circuit, while allowing the LEDs to be operated at maximum efficiency, which is usually obtained at a relatively low current. Therefore, to achieve a higher brightness, instead of increasing current (resulting in lower efficiency) through a string of LED modules, a string of LED modules having fewer LEDs may be energized at the optimum current. Time division multiplexing may be used to obtain any brightness level at a high efficiency.

FIGS. 24-38 illustrate various configurations of 2-terminal LED modules that may be formed as wafer-bonded modules, or where the passive or active circuitry is epitaxially grown on the same wafer as the LED, or where the passive or active circuitry is formed by diffusing or implanting dopants into the LED wafer. The modules may have a top electrode and a bottom electrode, where the bottom electrode is the cathode of the LED, and the top electrode is an electrode of the passive or active circuitry. Other orientations of the LED are envisioned. The circuits of FIGS. 24-38 control the current through the LED and/or provide substantially uniform luminance of the LED by reducing sensitivity to input voltage variations.

Figure 24:
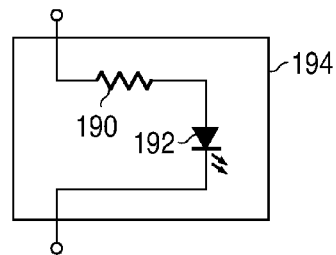

FIG. 24 illustrates a resistor 190 in series with an LED 192, in a single module die 194, for adjusting a current through the LED. The simplest V-to-I converter is realized with a series resistance, as in FIG. 24. The resistance buffers the variation of the LED voltage. For a large input voltage and a relatively small forward voltage of the LED, the current is approximately equal to the input voltage divided by the series resistance. If the input voltage is much larger than the forward LED voltage, then a fixed resistance, as in FIG. 24, may be sufficient to reduce the uncertainty in the LED properties. For RBG LED modules connected in parallel, the series resistance in each module may be selected so that each LED is simultaneously illuminated. This prevents an LED with a low forward voltage, such as the red LED, clamping the voltage across the green and blue LEDs to a voltage below the forward voltages of the green and blue LEDs. The series resistance drops a sufficient voltage to prevent such clamping.

Figure 25:
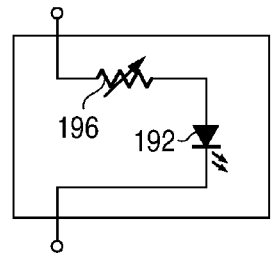

For input voltages close to the forward LED voltage, a variable resistance 196, such as shown in FIG. 25, is used in a 2-terminal module to adjust the current through the LED 192. A variable resistance is used since the forward voltage of the LED varies somewhat from LED to LED and the precision of the resistance value is important to achieve the required current. The variable resistance may be an active device, including a transistor.

Figure 26:
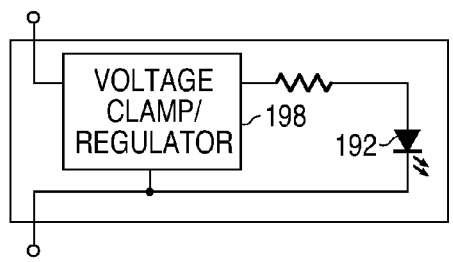
Figure 27:
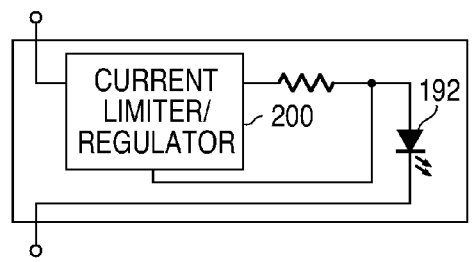

FIG. 26 illustrates a voltage clamp or regulator 198 in series with or across an LED 192 in a single module. The series resistor realization does not reduce the luminance sensitivity to input voltage variations. To buffer the voltage source uncertainty, a voltage clamp or regulator 198, or a current regulator or limiter 200, shown in FIG. 27, can be used. For sufficiently large input voltages, the luminance is therefore independent of the input voltage.

Figure 28:
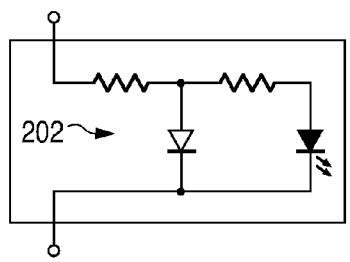
Figure 29:
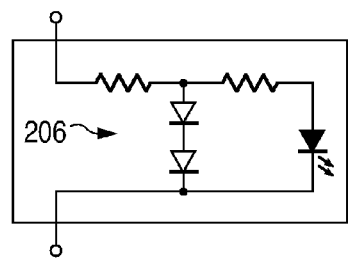
Figure 30:
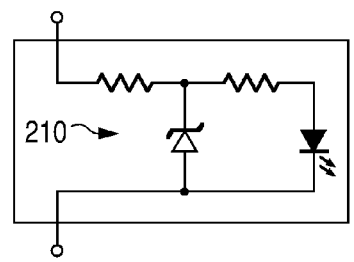

FIGS. 28, 29, and 30 illustrate different voltage clamps 202, 206, and 210 across the LED. A voltage clamp can be realized by a single diode (FIG. 28), several diodes in series (FIG. 29), or a zener diode (FIG. 30). The diode clamps limit the voltage applied to the LED, and the series resistances limit the current to the LED.

Figure 31:
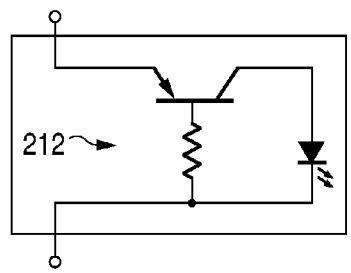
Figure 32:
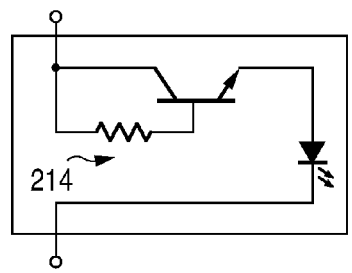

A more robust means of voltage clamping and diode limiting can be realized using transistors. FIG. 31 illustrates a clamp 212 across the LED, and FIG. 32 illustrates a current limiter 214 formed using transistors and resistors. The transistors provide an active means to vary the series resistance and hence reduce sensitivity to input voltage. The module of FIG. 9 may be used to form the circuit of FIG. 31 by forming a resistor in the semiconductor material connected between the base of the transistor and the negative terminal. Similarly, the module of FIG. 11 may be used to form the circuit of FIG. 32 by forming a resistor in the semiconductor material connected between the base of the transistor and the positive terminal.

Various other ones of the circuits of FIGS. 24-38 can be formed using the modules of FIGS. 9 and 11 by forming additional circuit elements in the semiconductor material and forming connections between the elements.

FIG. 33 illustrates a clamp 218 and FIG. 34 illustrates a current regulator 222 and clamp formed using transistors, resistors, and diodes.

FIG. 35 illustrates a current source 226 using two transistors. Better regulation can be achieved if more transistors are used.

FIG. 36 illustrates a voltage source 230 using two transistors.

FIG. 37 illustrates a series current source 234 using two transistors.

FIG. 38 illustrates any of the 2-terminal modules of FIGS. 24-37 connected in parallel, where the three modules 240, 242, 244 contain red, green, and blue LEDs to form a single light element in a light panel, such as for general illumination or backlighting. The circuitry 246 is set for each color LED to emit the desired brightness (by setting a certain current through the LED) while also setting the desired voltage drop across the module to allow each of RGB LEDs to turn on. The integrated LED modules can be paralleled to achieve uniform luminance without other external components. In another embodiment, all the LED are the same color, including blue LEDs with a phosphor coating to generate white light.

Any of the modules of FIGS. 24-38 may also include the transistor controllers of FIGS. 1-23 in series with the LED to form 3-terminal modules.

The proposed solutions described herein integrate the V-to-I driver with the LED in a single die. The driver and LED form an integrated circuit, which is fabricated on two wafer-bonded substrates or on the same substrate. This integration reduces intrinsic and parasitic uncertainty of the LED and the interconnection to the global system. The integration also greatly reduces the size and cost of the circuit compared to using non-integrated V-to-I drivers. This allows each LED to have its own dedicated driver.

Additionally, providing each LED with its own controllable driver enables each LED to be controlled to output a desired brightness despite process variations, changes in brightness with temperature, and changes in brightness with age.

The preceding examples have used MOSFETs and bipolar transistors; however, the scope of this invention is not limited by the transistor technology. Realizations can be created using a CMOS, BiCMOS, BCD, or other integrated circuit processes. Additional transistor technologies not shown could be used as well such as JFET, IGBT, Thyristor (SCR), Triac, and others.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A lighting device comprising:
    an inorganic first light emitting diode (LED) having a first top LED conducting surface and a first bottom LED conducting surface, the first LED being a vertical first LED, the first LED having an epitaxially grown n-type layer and an eptiaxially grown p-type layer between the first top LED conducting surface and the first bottom LED conducting surface; and
    a vertical first transistor in series with the first LED,
    the first transistor having a first terminal, a second terminal, and a third terminal,
    the first terminal being a bottom conducting surface of the first transistor, the bottom conducting surface of the first transistor opposing the first top LED conducting surface and being electrically and mechanically bonded to the first top LED conducting surface,
    the first transistor having a top surface, wherein the second terminal and third terminal are formed on the top surface,
    the bonded first LED and vertical first transistor being singulated together such that the first transistor is substantially the same size as the first LED,
    the first LED being configured to emit light when a first voltage is applied to the first bottom LED conducting surface, a second voltage is applied to the second terminal, and a first control voltage is applied to the third terminal.

2. The device of claim 1 wherein the first transistor is a FET.

3. The device of claim 2 wherein the first terminal is a drain terminal, the second terminal is a gate terminal, and the third terminal is a source terminal.

4. The device of claim 2 wherein the first terminal is a drain terminal, the second terminal is a source terminal, and the third terminal is a gate terminal.

5. The device of claim 1 wherein the first top LED conducting surface is an anode and the first bottom LED conducting surface is a cathode.

6. The device of claim 1 wherein the first top LED conducting surface is a cathode and the first bottom LED conducting surface is an anode.

7. The device of claim 1 wherein the first LED emits light of a first color, the device further comprising:
    a second LED having a second top LED conducting surface and a second bottom LED conducting surface, the second LED being a vertical second LED, the second LED emitting light of a second color; and
    a vertical second transistor in series with the second LED,
    the second transistor having a fourth terminal, a fifth terminal, and a sixth terminal, the fourth terminal being a bottom conducting surface of the second transistor, the bottom conducting surface of the second transistor being electrically and mechanically bonded to the second top LED conducting surface,
    the second transistor having a top surface, wherein the fifth terminal and sixth terminal are formed on the top surface of the second transistor,
    the bonded second LED and vertical second transistor being singulated together such that the second transistor is substantially the same size as the second LED,
    the second LED being configured to emit light when a third voltage is applied to the second bottom LED conducting surface, a fourth voltage is applied to the fifth terminal, and a second control voltage is applied to the sixth terminal,
    the first bottom LED conducting surface and the second bottom LED conducting surface being connected together,
    the second terminal of the first transistor and the fifth terminal of the second transistor being connected together.

8. The device of claim 7 wherein the first control voltage and the second control voltage are applied to energize the first LED and the second LED respectively, wherein the first control voltage and the second control voltage are time division multiplexed so as not to be on at the same time.

9. The device of claim 8 wherein the first LED has a first voltage drop across it when on, and the second LED has a second voltage drop across it when on, different from the first voltage drop.

10. The device of claim 7 wherein the first LED emits red light and the second LED emits one of blue light or green light.

11. The device of claim 7 wherein the first LED, first transistor, second LED, and second transistor are packaged together to create a multi-color light emitting device.

12. The device of claim 7 further comprising:
a third LED having a third top LED conducting surface and a third bottom LED conducting surface, the third LED being a vertical third LED, the third LED emitting light of a third color; and
a vertical third transistor in series with the third LED,
the third transistor having a seventh terminal, an eighth terminal, and a ninth terminal, the seventh terminal being a bottom conducting surface of the third transistor, the bottom conducting surface of the third transistor being electrically and mechanically bonded to the third top LED conducting surface,
the third transistor having a top surface, wherein the eighth terminal and ninth terminal are formed on the top surface of the third transistor,
the bonded third LED and vertical third transistor being singulated together such that the third transistor is substantially the same size as the third LED,
the third LED being configured to emit light when a fifth voltage is applied to the third bottom LED conducting surface, a sixth voltage is applied to the eighth terminal, and a third control voltage is applied to the ninth terminal,
the first bottom LED conducting surface, the second bottom LED conducting surface, and the third bottom LED conducting surface being connected together,
the second terminal of the first transistor, the fifth terminal of the second transistor, and the eighth terminal of the third transistor being connected together.

13. The device of claim 12 wherein the first control voltage, the second control voltage, and the third control voltage are applied to energize the first LED, the second LED, and the third LED, respectively, wherein the first control voltage, the second control voltage, and the third control voltage are time division multiplexed so as not to be on at the same time.

14. The device of claim 13 wherein the first LED has a first voltage drop across it when on, the second LED has a second voltage drop across it when on, and the third LED has a third voltage drop across it when on, different from the first voltage drop and the second voltage drop.

15. The device of claim 12 wherein the first LED emits red light, the second LED emits green light, and the third LED emits blue light.

16. The device of claim 12 wherein the first LED, first transistor, second LED, second transistor, third LED, and third transistor are packaged together to create a multi-color light emitting device.

17. The device of claim 16 wherein the multi-color light emitting device is packaged in a display screen having a substrate having conductors connected to the first bottom LED conducting surface, the second bottom LED conducting surface, and the third bottom LED conducting surface, wherein light from the first LED, second LED, and third LED is emitted through the substrate.

18. The device of claim 16 wherein the multi-color light emitting device is packaged in a light panel having a substrate having conductors connected to the first bottom LED conducting surface, the second bottom LED conducting surface, and the third bottom LED conducting surface, wherein light from the first LED, second LED, and third LED is emitted through the substrate.

19. The device of claim 12 wherein the first LED in combination with the first transistor forms a first module, the second LED in combination with the second transistor forms a second module, and the third LED in combination with the third transistor forms a third module, the device further comprising:
an array formed of a plurality of first modules, a plurality of second modules, and a plurality of third modules.

20. The device of claim 19 wherein the first modules are connected in series between two voltages, the second modules are connected in series between the two voltages, and the third modules are connected in series between the two voltages, and
wherein the first control voltage is applied to the third terminal of the first transistor in each of the first modules, the second control voltage is applied to the sixth terminal of the second transistor in each of the second modules, and the third control voltage is applied to the ninth terminal of the third transistor in each of the third modules.

21. The device of claim 20 wherein at least one first resistor is connected in series between the third terminals of the first modules, at least one second resistor is connected in series between the sixth terminals of the second modules, and at least one third resistor is connected in series between the ninth terminals of the third modules, such that the light emitted by each of the first LEDs in the array is substantially the same, the light emitted by each of the second LEDs in the array is substantially the same, and the light emitted by each of the third LEDs in the array is substantially the same.

22. The device of claim 19 wherein the first modules output red light, the second modules output green light, and the third modules output blue light,
wherein the third terminals of the first modules are connected to a red light address bus, the sixth terminals of the second modules are connected to a green light address bus, and the ninth terminals of the third modules are connected to a blue light address bus, wherein the red light address bus overlies and is insulated from the green light address bus and the blue light address bus.

23. A lighting device comprising:
a GaN transistor epitaxially grown on a growth substrate, wherein the growth substrate has been removed, the transistor having a top GaN surface and a bottom GaN surface, the transistor being a vertical transistor; and
a GaN-based light emitting diode (LED) epitaxially grown on the bottom GaN surface of the transistor, the LED having a bottom surface;
the transistor having a control terminal and a first terminal on its top surface,
the LED having a second terminal electrically connected to its bottom surface,
the LED being configured to emit light when a first voltage is applied to the second terminal, a second voltage is applied to the first terminal, and a control voltage is applied to the control terminal.

24. The device of claim 23 wherein the transistor is a FET.

25. The device of claim 24 wherein the bottom surface of the transistor, abutting the LED, is a drain, and the top surface of the transistor comprises a source.

26. The device of claim 23 wherein the control terminal contacts a gate of the transistor and wherein the first terminal contacts a source of the transistor.

27. The device of claim 23 wherein the second terminal of the LED is an anode terminal.

28. The device of claim 23 wherein the second terminal of the LED is a cathode terminal.

29. A lighting device comprising:
- a GaN-based light emitting diode (LED) epitaxially grown on a growth substrate, the LED having a top GaN surface and a bottom GaN surface; and
- a GaN transistor epitaxially grown on the bottom GaN surface of the LED, the transistor having a bottom surface, the transistor being a vertical transistor;
- the transistor having a control terminal and a first terminal on its bottom surface,
- the LED having a second terminal electrically connected to its top surface,
- the LED being configured to emit light when a first voltage is applied to the second terminal, a second voltage is applied to the first terminal, and a control voltage is applied to the control terminal.

30. The device of claim 29 wherein the transistor is a FET.

31. The device of claim 30 wherein a top surface of the transistor, abutting the LED, is a drain, and the bottom surface of the transistor comprises a source.

32. The device of claim 30 wherein the control terminal contacts a gate of the transistor and wherein the first terminal contacts a source of the transistor.

33. The device of claim 29 wherein the second terminal of the LED is an anode terminal.

34. The device of claim 29 wherein the second terminal of the LED is a cathode terminal.

35. The device of claim 29 wherein the growth substrate has been removed.

* * * * *